United States Patent
Kidokoro

(10) Patent No.: US 8,159,827 B2
(45) Date of Patent: Apr. 17, 2012

(54) CIRCUIT BOARD AND METHOD OF MOUNTING ELECTRONIC COMPONENT ON PRINTED BOARD

(75) Inventor: Hitoshi Kidokoro, Chiyoda-ku (JP)

(73) Assignee: Mitsubishi Electric Company, Tokyo (JP)

( * ) Notice: Subject to any disclaimer, the term of this patent is extended or adjusted under 35 U.S.C. 154(b) by 151 days.

(21) Appl. No.: 12/744,295

(22) PCT Filed: Dec. 22, 2008

(86) PCT No.: PCT/JP2008/003897
§ 371 (c)(1),
(2), (4) Date: May 21, 2010

(87) PCT Pub. No.: WO2009/090717
PCT Pub. Date: Jul. 23, 2009

(65) Prior Publication Data
US 2010/0315794 A1 Dec. 16, 2010

(30) Foreign Application Priority Data

Jan. 17, 2008 (JP) ................................. 2008-007967

(51) Int. Cl.
*H05K 9/00* (2006.01)
(52) U.S. Cl. ........ 361/760; 361/773; 174/260; 174/263; 174/267; 257/692; 257/696; 257/735; 257/750; 257/779
(58) Field of Classification Search .......... 361/760–767, 361/772–778, 790–798, 807–811; 174/260–267; 257/692–698, 735–738, 770–784; 29/564.1, 29/740, 741, 825–852, 885
See application file for complete search history.

(56) References Cited

U.S. PATENT DOCUMENTS

| | | | | | |
|---|---|---|---|---|---|
| 2,902,629 | A | * | 9/1959 | Little et al. | 361/773 |
| 2,942,332 | A | * | 6/1960 | Wright et al. | 29/832 |
| 3,058,037 | A | * | 10/1962 | Naab et al. | 361/744 |
| 3,466,732 | A | * | 9/1969 | Taylor, Jr | 29/839 |
| 6,104,267 | A | * | 8/2000 | Palmer et al. | 335/151 |

FOREIGN PATENT DOCUMENTS

| | | | |
|---|---|---|---|
| FR | 002645697 | A1 * | 10/1990 |
| JP | 39-22470 | Y1 | 8/1964 |
| JP | 53-067054 | A | 6/1978 |
| JP | 60-78162 | U | 5/1985 |
| JP | 60-106374 | U | 7/1985 |
| JP | 61-40095 | A | 2/1986 |
| JP | 5-53143 | U | 7/1993 |
| JP | 07-038228 | A | 2/1995 |
| JP | 11-017306 | A | 1/1999 |

* cited by examiner

*Primary Examiner* — Michail V Datskovskiy
(74) *Attorney, Agent, or Firm* — Sughrue Mion, PLLC

(57) ABSTRACT

When U-shape formed electronic components having an axial lead shape are mounted upright on a printed board, two U-shape formed electronic components having an axial lead shape are arranged so as not to be in the same straight line, and a wiring pattern is formed in a state where bent-side lead wires have the same electric potential, and the electronic components are inclined so as to place the bent-side lead wires close to each other, whereby the electronic components that tend to fall in the inclined direction can be mutually supported by the bent-side lead wires. Thus, the electronic components can be prevented from falling without spoiling a heat dissipation performance of the electronic component and the board, and without greatly deteriorating an assembly performance of the board.

9 Claims, 3 Drawing Sheets (a) Oblique perspective view
(b) Top view
(c) Side view (a) Connected in parallel
(b) Connected in series Oblique perspective view     Top view     Side view (a) Oblique perspective view — Fix by twisting
(b) Top view
(c) Side view

CIRCUIT BOARD AND METHOD OF MOUNTING ELECTRONIC COMPONENT ON PRINTED BOARD

TECHNICAL FIELD

The present invention relates to a circuit board in which an electronic component having an axial lead shape is densely mounted on a printed board, and a method of mounting the electronic component.

BACKGROUND ART

In general, when an electronic component having an axial lead shape (hereinafter, simply referred to as an electronic component), which has lead wires at its both ends is densely mounted on a printed board, an electronic component 2 is mounted upright on a printed board 1 as illustrated in FIG. 9 (*a*), in a state where the electronic component 2 is formed to have a U-shape by bending one of lead wires 3 by roughly 180 degrees (hereinafter, referred to as "U-shape formed"). However, the electronic component mounted in this state easily falls, and if the electronic component falls, a trouble such as a short circuit may occur when the electronic component is brought into contact with an adjacent electronic component. Therefore, countermeasures are performed in a conventional method as illustrated in FIG. 9 (*b*), in which the electronic component 2 is fixed by a bond 4 to prevent from falling, or the lead wire 3 of the electronic component 2 is covered with an insulative resin tube 5 (for example, refer to Patent Document 1).

Moreover, in another conventional method, an electronic component is formed to have a stand portion at a tip of a lead wire of the electronic component and mounted on a printed board (for example, refer to Patent Document 2).
[Patent Document 1]
Japanese Laid-Open Patent Publication No. H7-38228
[Patent Document 2]
Japanese Laid-Open Patent Publication No. H11-17306

DISCLOSURE OF THE INVENTION

Problems to be Solved by the Invention

In a conventional method, if an electronic component is covered by applying a bond to fix the electronic component or a lead wire of the electronic component is covered with an insulative tube, there have been problems in that a heat dissipation performance is spoiled, and a temperature of the electronic component and a board is increased. In particular, because the electronic component having an axial lead shape has a high heat dissipation performance, the electronic component is often a high-power element, and it is imperative to ensure the heat dissipation performance. Moreover, because the bond is applied and the insulative tube is attached, there have been problems in that the assembly performance of the circuit board of the electronic component is greatly deteriorated, and long time is needed for assembling, and an assembling efficiency is reduced.

Moreover, in a conventional method, an electronic component which is formed to have a stand portion at a tip of a lead wire of the electronic component can stand by itself without falling, when it is mounted on a printed board. However, after the electronic component is mounted, a state of the electronic component is almost the same as the state in FIG. 9 (*a*), and there has been a possibility that the electronic component falls.

The present invention has been made to solve the above-described problems, and an object of the invention is to provide a circuit board and a method of mounting an electronic component on a printed board, which can prevent a U-shape formed electronic components having an axial lead shape from falling without spoiling the heat dissipation performance of the electronic component and the board, and without greatly deteriorating the assembly performance of the board.

Means for Solving Problems

In a circuit board related to the present invention, two U-shape formed electronic components having an axial lead shape are arranged so as not to be in the same straight line, and a wiring pattern is formed in a state where bent-side lead wires of the respective components have the same electric potential, and the electronic components are inclined so as to place the bent-side lead wires close to each other, whereby the electronic components that tend to fall in the inclined direction can be mutually supported by the bent-side lead wires.

Effects of the Invention

In the present invention, two U-shape formed electronic components having an axial lead shape are inclined so as to be mutually supported by bent-side lead wires, whereby the U-shape formed electronic components on a board can be prevented from falling without spoiling the heat dissipation performance of the electronic components and the board, and without greatly deteriorating the assembly performance of the board.

BEST MODE FOR CARRYING OUT THE INVENTION

Embodiment 1

Figure 1:
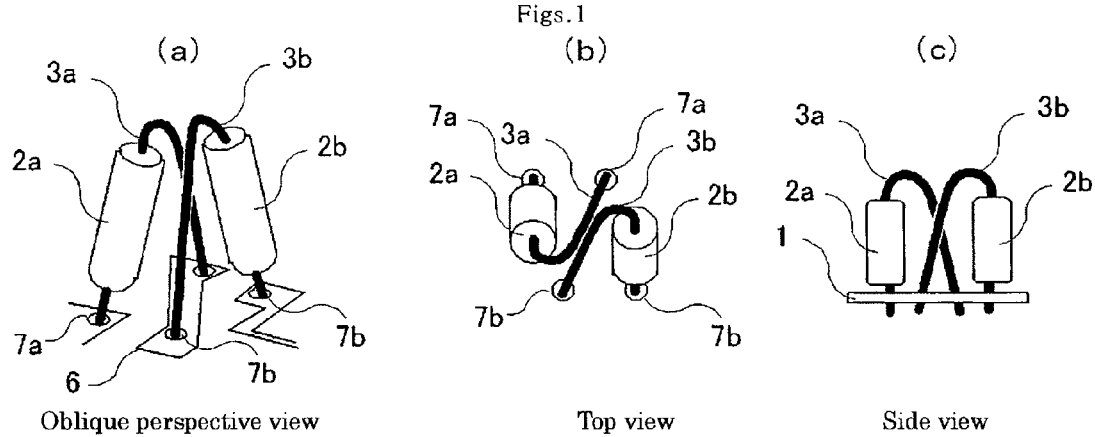
FIG. 1 are diagrams illustrating a circuit board according to Embodiment 1 of the present invention.

FIG. 1 are configuration diagrams illustrating a circuit board and a method of mounting electronic components on a printed board according to Embodiment 1 of the present invention. FIG. 1 (a) is an oblique perspective view of electronic components 2a and 2b and a printed board 1 after the two electronic components 2a and 2b are mounted on the printed board 1 according to the present invention. Moreover, FIG. 1 (b) is a top view in which the configuration in FIG. 1 (a) is viewed from directly above, and FIG. 1 (c) is a side view in which the configuration in FIG. 1 (a) is viewed from a lateral side.

In FIG. 1, a bent-side lead wire 3a of one of the electronic components 2a and a bent-side lead wire 3b of the other of the electronic components 2b are set to be at the same electric potential, and are electrically connected by a wiring pattern 6 on the printed board 1. Moreover, total four component holes 7—two component holes 7a for inserting the lead wires of the electronic component 2a and two component holes 7b for inserting the lead wires of the electronic component 2b—are provided on the printed board 1 so as not to be in a same straight line. Furthermore, the electronic components 2a and 2b are mounted so that the respective bent-side lead wires 3a and 3b face each other, and the components are inclined in directions in which the bent-side lead wires 3a and 3b are placed close to each other.

Here, as illustrated in FIG. 1, the component holes 7 of two electronic components 2a and 2b are arranged at positions such that, when the electronic components 2a and 2b are inclined in directions in which the respective bent-side lead wires 3a and 3b are placed close to each other, the bent-side lead wires 3a and 3b are brought into contact with each other before the components completely fall, and the electronic components 2a and 2b are mutually supported so as to prevent the components from inclining any more. As a matter of course, because it is an object to densely mount the electronic components, it is desirable that the component holes 7 are arranged at positions such that the two electronic components 2a and 2b are arranged as close as possible.

Figure 2:
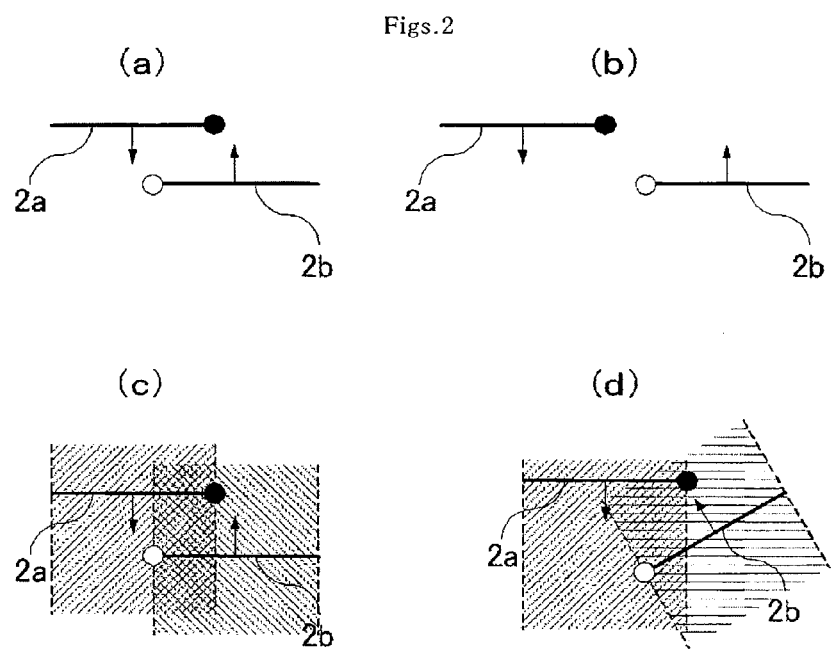
FIG. 2 are schematic diagrams illustrating mounting examples of electronic components on a circuit board according to Embodiment 1 of the present invention.

Hereinafter, a specific arrangement of the component holes will be explained. FIG. 2 are schematic diagrams in which each of electronic components 2 on the printed board is expressed as a line segment connecting two component holes 7 for the electronic component, and component holes for inserting the bent-side lead wires are expressed as filled circles or open circles. Arrows in FIG. 2 indicate directions in which the electronic components 2 are inclined. FIG. 2 (a) is a diagram just corresponding to FIG. 1 (b).

FIG. 2 (b) is an arrangement diagram in which each of electronic components 2a and 2b in FIG. 2 (a) is moved in a direction in which the electronic components are separated along the line segment direction. In this case, it is obvious that the bent-side lead wires 3a and 3b are not brought into contact with each other, even if the electronic components 2a and 2b are inclined in the respective arrow directions. In other words, on the printed board as illustrated in FIG. 2 (c), the arrangement along the direction of the line segment must be set in such a manner that the component hole (the open circle in FIG. 2 (c)) for inserting the bent-side lead wire of the electronic component 2b is present within an area in which the line segment of the electronic component 2a can be moved in a vertical direction with respect to the line segment corresponding to the electronic component 2a.

On the other hand, on the printed board, the component hole (the filled circle in FIG. 2 (c)) for inserting the bent-side lead wire of the electronic component 2a must be arranged within an area in which the line segment of the electronic component 2b can be moved in a vertical direction with respect to the line segment corresponding to the electronic component 2b. As a matter of course, a distance between the line segments indicating the electronic components or a distance between the line segment of one of the electronic components and the component hole for inserting the bent-side lead wire of the other of the electronic components must be shorter than the height of the U-shape formed electronic component, because the lead wires must be brought into contact with each other.

Moreover, although two line segments are arranged in parallel in FIG. 2 (a), as long as the filled circle and the open circle are present at positions that meet a condition indicated in FIG. 2 (c), even if the two line segments are not arranged in parallel as illustrated in FIG. 2 (d), the lead wires are brought into contact and supported with each other when the electronic components are inclined in the respective arrow directions. However, an arrangement that the line segments cross must be eliminated, because the electronic components can not be arranged.

In FIG. 1, the electronic components 2a and 2b are mounted in a state where the electronic components are inclined in directions in which the respective bent-side lead wires 3a and 3b are placed close to each other and a small gap remains between the two lead wires 3a and 3b. However, it is not necessary to leave the gap between the two lead wires 3a and 3b, and the electronic components 2a and 2b may be brought in contact with each other by inclining the electronic components in directions in which the respective lead wires 3a and 3b are placed close to each other.

Hereinafter, a method by which the bent-side lead wires 3a and 3b of the electronic components 2a and 2b are set to be at the same electric potential will be explained.

Figure 3:
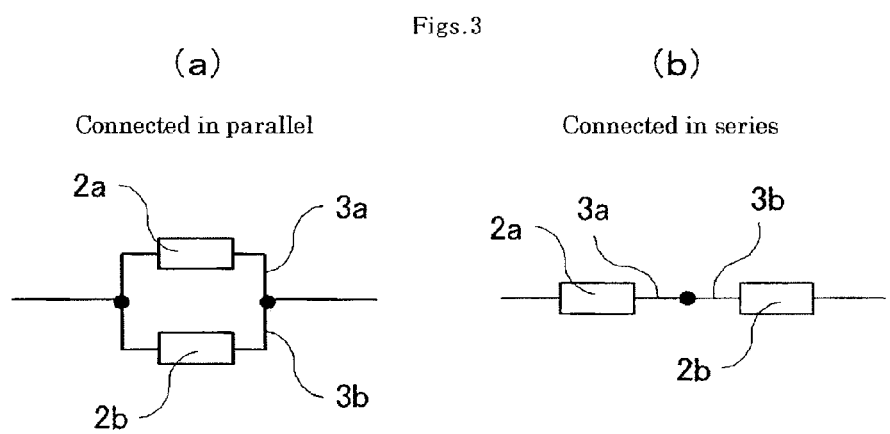
FIG. 3 are circuit diagrams for explaining methods by which bent lead wires are set to be at the same electric potential.

FIG. 3 are circuit diagrams indicating connection examples of electronic components, FIG. 3 (a) is a circuit diagram in which two electronic components are connected in parallel, and FIG. 3 (b) is a circuit diagram in which two electronic components are connected in series.

In FIG. 3 (a), when two electronic components 2a and 2b are connected in parallel, because the lead wires on both ends of the electronic component 2a are connected to the respective lead wires on both ends of the electronic component 2b, any of the lead wires can be bent. In FIG. 3 (a), the lead wires 3a and 3b on the right side of the electronic components are set as lead wires to be bent, and the wiring pattern 6 and the component holes 7 as illustrated in FIG. 1 are formed on the printed board 1, whereby the two electronic components 2a and 2b can be mounted as illustrated in FIG. 1.

In FIG. 3 (b), when two electronic components 2a and 2b are connected in series, because either of the lead wires on both ends of one of the electronic components 2a is connected to either of the lead wires on both ends of the other of the electronic components 2b, the lead wires at a side on which the electronic components 2a and 2b are connected with each other are to be bent. In FIG. 3 (b), the lead wires 3a and 3b in the middle portion in FIG. 3 (b) are set as lead wires to be bent, and the wiring pattern 6 and the component holes 7 as illustrated in FIG. 1 are formed on the printed board 1, whereby the two electronic components 2a and 2b can be mounted as illustrated in FIG. 1.

As described above, when there are two electronic components that are connected in parallel or in series, the lead wires 3a and 3b, at the same electric potential side, of the electronic components 2a and 2b are bent, and the electronic components 2a and 2b are inclined in such a manner that the bent-side lead wires 3a and 3b are placed close to each other, whereby a configuration can be achieved in which it does not matter even if the lead wires 3a and 3b are brought into contact with each other because they are at the same electric potential.

Figure 4:
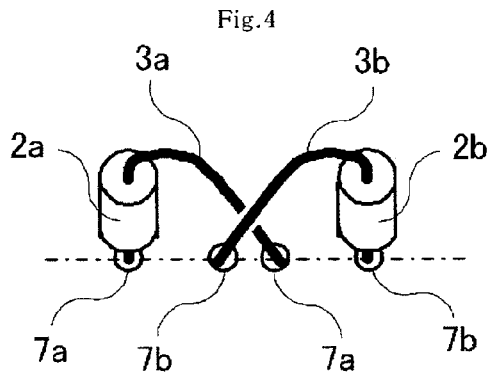
FIG. 4 is a diagram illustrating a circuit board for explaining a problem when component holes are arranged in the same straight line on a circuit board according to Embodiment 1 of the present invention.
Figure 9:
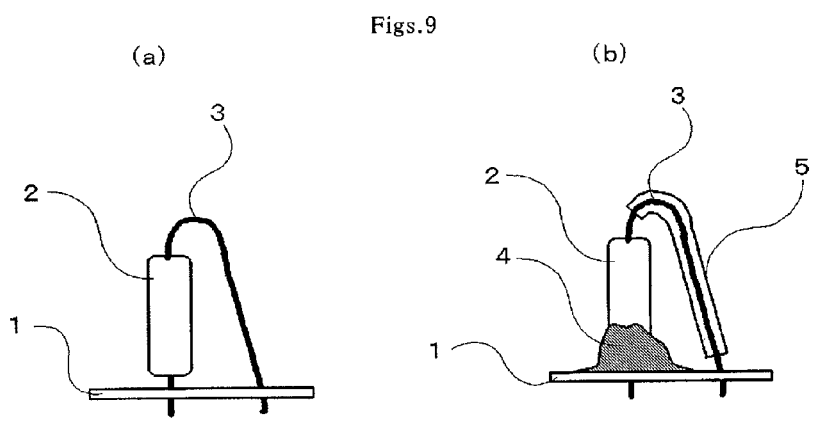
FIG. 9 are diagrams illustrating conventional ways of mounting an electronic component on a printed board.

Hereinafter, the reason why the component holes of the electronic components are not arranged in the same straight line will be explained. FIG. 4 is a configuration diagram that is viewed from the obliquely upward side in a state where electronic components 2a and 2b are mounted on the printed board 1 in such a way that component holes 7a and 7b for inserting lead wires of the electronic components 2a and 2b are arranged in the same straight line, the bent-side lead wires 3a and 3b are placed close to each other, and the lead wires 3a and 3b are brought into contact and supported with each other when the electronic components are inclined. Moreover, FIG. 5 (a) is a side view that is viewed from the electronic component 2a side. When the component holes 7 are arranged in the same straight line, the electronic components 2a and 2b are mounted with a roughly upstanding state as illustrated in FIG. 4. In this case, the lead wires 3a and 3b are supported with each other in directions in which the bent lead wires 3a and 3b are brought into contact, for example, a front side direction in FIG. 4 with respect to the electronic component 2a, a dashed arrow direction in FIG. 5 (a), and a back side direction in FIG. 4 with respect to the electronic component 2b, so that the electronic components do not easily fall. However, when the electronic components are inclined in directions opposite of the directions described above, for example, when the electronic component 2a is inclined in a solid arrow direction in FIG. 5 (a), the electronic component 2a is in a no-support state. In other words, the electronic component 2a in the upstanding state falls in a no-support direction, and this state is the same as the conventional mounting state illustrated in FIG. 9, so that a possibility that the electronic components fall is the same as the possibility in the conventional mounting state.

Meanwhile, when the component holes 7a and 7b of the electronic components 2a and 2b are not arranged in the same straight line as illustrated in FIG. 1, and the electronic components 2a and 2b are inclined in directions in which the bent-side lead wires 3a and 3b are placed close to each other, the mounting state is as described below.

Figure 5:
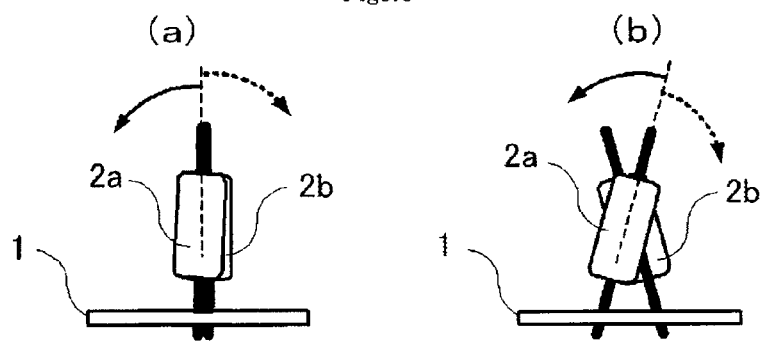
FIG. 5 are diagrams illustrating a circuit board for explaining a problem when component holes are arranged in the same straight line on a circuit board according to Embodiment 1 of the present invention.

FIG. 5 (b) is a side view that is viewed from the electronic component 2a side in FIG. 1. When the electronic component 2a is inclined in a dashed arrow direction in FIG. 5 (b), the electronic component 2a is supported by the lead wires 3a and 3b being brought into contact with each other, so that a possibility that the electronic component 2a falls is low. Meanwhile, when the electronic component 2a is inclined in a solid arrow direction, the electronic component 2a is in a no-support state. However, the electronic component 2a is required to be inclined in a direction opposite to the direction in which it is already inclined as illustrated in FIG. 5 (b), so that a possibility that the electronic component 2a falls is obviously lower than a possibility that the electronic component 2a is inclined from the upstanding state as illustrated in FIG. 5 (a).

In other words, when the two U-shape formed electronic components 2 are mounted on the printed board 1 in a state where those are inclined as illustrated in FIG. 1, a possibility that the electronic components 2 fall in a direction in which those are inclined can be decreased by the bent-side lead wires 3 being brought into contact with and supporting each other. Moreover, a possibility that the electronic components 2 fall in a direction opposite to the direction in which those are inclined can be decreased, because the electronic components 2 are required to be inclined in a direction opposite to the direction in which those are already inclined.

In this case, regarding the method of mounting the electronic components 2 on the printed board 1, the electronic components 2 can be mounted in a state where those are inclined in a direction in which the bent-side lead wires 3 are placed close to each other, or the electronic components 2 can be inclined in the direction in which the bent-side lead wires 3 are placed close to each other after the electronic components 2 are mounted in the upstanding state.

As described above, when the U-shape formed electronic components having an axial lead shape are mounted upright on the printed board, the wiring pattern is formed on the circuit board according to Embodiment 1 in such a way that the component holes for inserting the lead wires of the two electronic components are arranged so as not to be in the same straight line, and when the two electronic components are inclined so as to place the bent-side lead wires close to each other, the bent-side lead wires are brought into contact and supported with each other before the components fall, and the bent-side lead wires have the same electric potential. Therefore, there is an effect of preventing an electronic component from falling without fixing the electronic component by a bond or the like. Thus, it is not necessary to cover the lead wire of the electronic component or another adjacent electronic component with an insulative tube, the heat dissipation performance of the electronic component is not spoiled, and the assembly performance of the circuit board is improved, so that the work efficiency can be improved and the low cost can be achieved.

Embodiment 2

Figure 6:
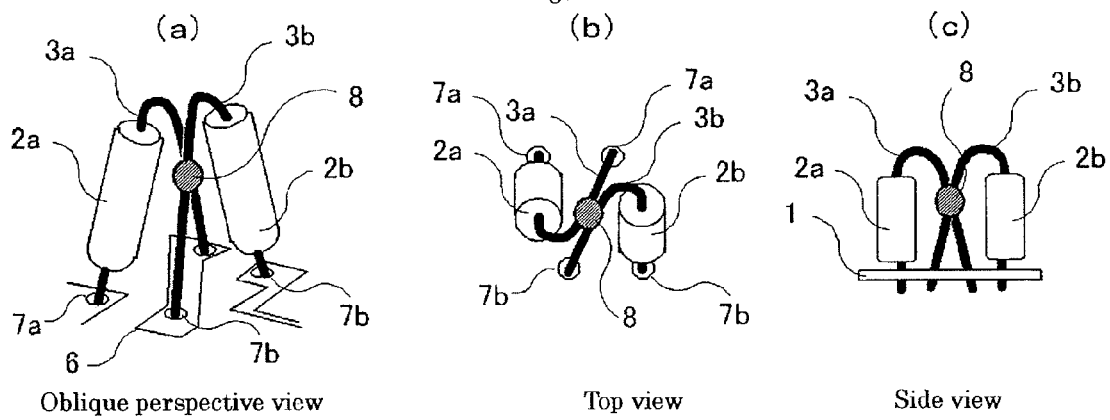
FIG. 6 are diagrams illustrating a circuit board according to Embodiment 2 of the present invention.

FIG. 6 are configuration diagrams illustrating a circuit board and a method of mounting electronic components on a printed board, according to Embodiment 2 of the present invention. FIG. 6 (a) is an oblique perspective view of two electronic components 2a and 2b and a printed board 1 after the electronic components 2a and 2b are mounted on a printed board 1 according to the present embodiment. Moreover, FIG. 6 (b) is a top view in which the configuration in FIG. 6 (a) is viewed from directly above, and FIG. 6 (c) is a side view in which the configuration in FIG. 6 (a) is viewed from a lateral side.

In the present embodiment, arrangements of the electronic components 2, the component holes 7, and the wiring pattern 6 are similar to those in Embodiment 1. Moreover, in the present embodiment, in order to further decrease a possibility that the electronic components fall, a solder 8 is applied, as illustrated in FIG. 6, to a portion on which the bent-side lead wires 3a and 3b of the two electronic components 2a and 2b are close to each other, or to a contact portion if they are in contact with each other, so that the lead wires 3a and 3b are fixed and integrated.

Therefore, when the electronic components 2a and 2b fall in the directions in which they are inclined, in other words, when the electronic component 2a tries to fall in a dashed arrow direction in FIG. 5 (b), the bent-side lead wires 3a and 3b are integrated by the solder 8, and the lead wires 3a and 3b do not deviate from each other, so that the possibility that the electronic components fall can be decreased lower than the possibility in Embodiment 1. Moreover, when each of the electronic components 2a and 2b falls in a direction opposite to the direction in which they are inclined, in other words, when the electronic component 2a falls in a solid arrow direction in FIG. 5 (b), the integration of the lead wires 3a and 3b by the solder 8 must be released. However, the soldering is usually hard, so that the possibility that the electronic components fall can be obviously decreased lower than the possibility in Embodiment 1.

Hereinafter, the reason why the component holes are not arranged in the same straight line will be explained. When the component holes are arranged in the same straight line, the components are configured as illustrated in FIG. 5 (a). In this case, if the bent-side lead wires 3a and 3b are connected by the solder 8, the electronic component 2a falls together with the electronic component 2b as long as the solder 8 does not come off, whether the electronic component 2a falls in a dashed arrow direction or a solid arrow direction in FIG. 5 (a). In this case, because all the lead wires are arranged in the same straight line, the mounting state of the electronic components is similar to the conventional mounting state in FIG. 9 (a). The number of the lead wires is two in FIG. 9 (a), whereas the number of the lead wires is four in FIG. 5 (a), so that the electronic components in FIG. 5 (a) falls less easily as compared with those in FIG. 9 (a). However, because the lead wires are arranged in the same straight line, a positional relationship between the electronic components and the printed board is not uniquely determined, and the electronic components can be freely inclined in a vertical direction with respect to a direction in which the lead wires are arranged, so that obviously there is a possibility that the electronic components fall.

Meanwhile, in a case in which the lead wires are not arranged in the same straight line as illustrated in FIG. 5 (b), because the electronic components 2a and 2b are integrated together by the solder 8 and the lead wires are not in the same straight line, the positional relationship between the electronic components and the printed board is uniquely determined, and the electronic components are nearly fixed in any direction in which they are inclined, so that the possibility of falling is very small.

Hereinafter, a specific arrangement of the component holes will be explained. Basically, in a way similar to FIG. 2 explained in Embodiment 1, on the printed board, a component hole for inserting the bent-side lead wire of one of the electronic components must be arranged within an area in which a line segment of the other of the electronic components can be moved in a vertical direction with respect to the line segment, and vice versa. However, in the present embodiment, because the lead wires of each electronic component are fixed by the solder, the electronic components do not have to be supported with each other as described in Embodiment 1, and the component holes for the two electronic components fixed by the solder only have to be arranged not in the same straight line, as described above. The arrangement examples of the electronic components are illustrated in FIG. 7.

Figure 7:
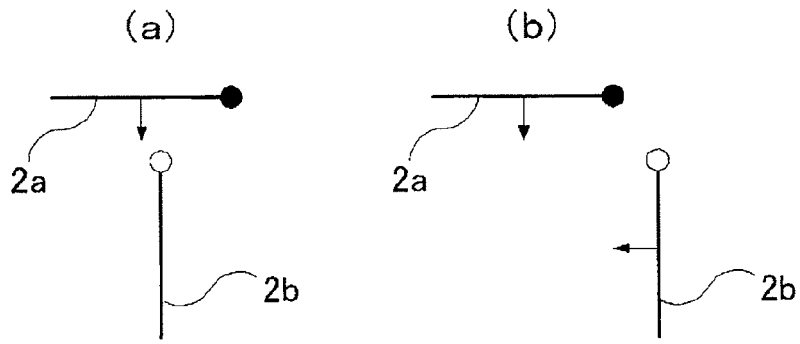
FIG. 7 are schematic diagrams illustrating mounting examples of electronic components on a circuit board according to Embodiment 2 of the present invention.

FIG. 7 are schematic diagrams in which each of electronic components 2 is expressed as a line segment connecting two component holes 7 for the electronic component, and component holes for inserting the bent-side lead wires are illustrated as filled circles or open circles. Arrows in FIG. 7 similarly indicate directions in which the electronic components 2 are inclined.

In FIGS. 7 (a) and (b), the line segments indicating the electronic components 2a and 2b are nearly perpendicular. In FIG. 7 (a), on the printed board, the open circle of the electronic component 2b is arranged within an area in which the line segment of the electronic component 2a can be moved in a vertical direction with respect to the line segment of the electronic component 2a, whereas the filled circle of the electronic component 2a is not arranged within an area in which the line segment of the electronic component 2b can be moved in a vertical direction with respect to the line segment of the electronic component 2b. As a result, the electronic component 2a is supported by the lead wire of the electronic component 2b if the electronic component 2a is inclined in an arrow direction, whereas the electronic component 2b is not supported whether the electronic component 2b is inclined rightward or leftward. Moreover, in FIG. 7 (b), each of the filled circle of the electronic component 2a and the open circle of the electronic component 2b is not arranged within an area in which a line segment of the other of the electronic components can be moved in a vertical direction with respect to the line segment. As a result, even if the lead wires are brought into contact with each other after the electronic components are inclined in the arrow directions in which the lead wires are placed close to each other, the electronic components are not set in a state where they are supported with each other.

However, in both of FIGS. 7 (a) and (b), the electronic components are inclined in the arrow directions and are soldered in a portion where the bent-side lead wires are brought close to or into contact with each other, and the lead wires are fixed to each other, whereby the electronic components are set in a state where they are not easily inclined in any direction because the component holes are not arranged in the same straight line. In other words, a configuration is required in which the electronic components are supported with each other by being inclined in Embodiment 1, whereas the electronic components do not have to be supported with each other in the present embodiment, and the bent-side lead wires only have to be in contact with each other. Moreover, as illustrated in FIG. 7 (a), a configuration may be used in which either one of the two electronic components is inclined so that the bent-side lead wires are brought into contact with each other.

Next, regarding the method of mounting the electronic components 2 on the printed board 1, the electronic components 2 may be soldered, after the electronic components 2 are mounted in a state where they are inclined in directions in which the bent-side lead wires 3 are placed close to each other. Moreover, the electronic components 2 may be soldered, after the electronic components 2 are mounted in an upstanding state and then inclined in directions in which the bent-side lead wires 3 are placed close to each other. Furthermore, two electronic components 2 that are already soldered may be mounted on the printed board 1. Thus, the mounting method according to Embodiment 2 is very effective, because a possibility that the electronic components fall can be minimized although the assembly performance of the circuit board is slightly lower in comparison with the assembly performance in Embodiment 1, and because the heat dissipation performance is the same as that in Embodiment 1.

As described above, in the circuit board according to the present embodiment, when the U-shape formed electronic components having an axial lead shape are mounted upright on the printed board, the wiring pattern is formed in such a way that each of component holes for inserting each of lead wires of two electronic components is arranged so as not to be in the same straight line, and when the two electronic components are inclined so as to place the bent-side lead wires close to each other, the bent-side lead wires are brought into contact with each other before the components fall, and the bent-side lead wires have the same electric potential. Moreover, because each of the bent-side lead wires is fixed and integrated by the solder, a possibility that the electronic components fall can be further decreased in comparison with the possibility of the circuit board described in Embodiment 1.

In the present embodiment, the bent-side lead wires are fixed and integrated together by using a fixing means by soldering. However, the fixing means is not limited to soldering. Other fixing means that can fix two lead wires is effectively used whether it is conductive or nonconductive.

For example, the same effect can be achieved, if the contact portion of two lead wires is covered with the other metallic wire, or the contact portion is fixed by a bond.

Although the method of mounting two electronic components is explained in the present embodiment, electronic components may be prevented from falling by soldering lead wires of three electronic components or more. In this case, if at least two electronic components of the three or more electronic components are configured in the same way as in the present embodiment, the same effect can be achieved.

Embodiment 3

Figure 8:
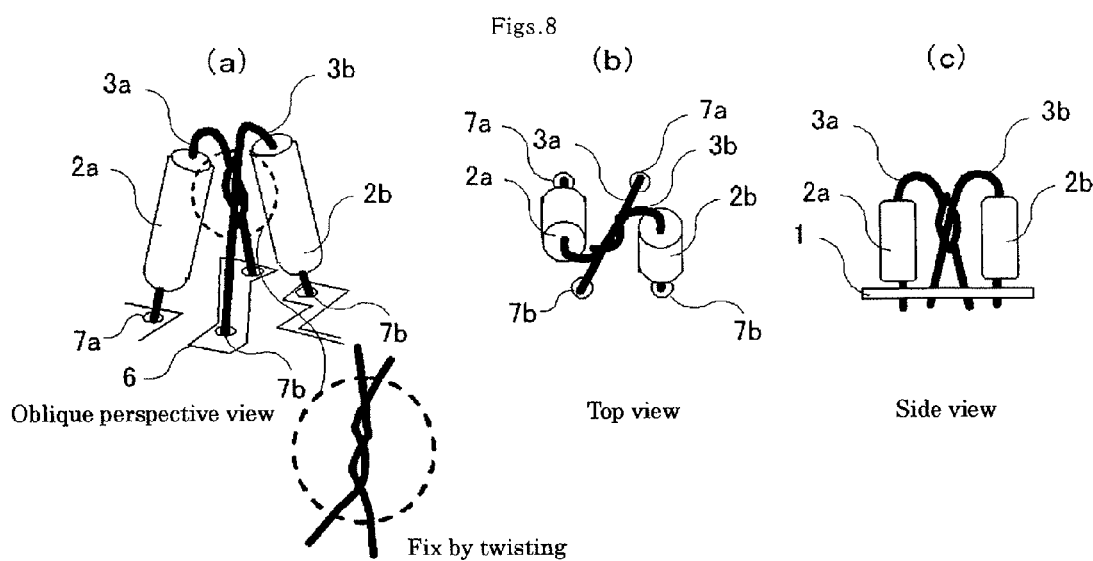
FIG. 8 are diagrams illustrating a circuit board according to Embodiment 3 of the present invention.

FIG. 8 are configuration diagrams illustrating a circuit board and a method of mounting electronic components on a printed board, according to Embodiment 3 of the present invention. FIG. 8 (a) is an oblique perspective view of two electronic components 2a and 2b and a printed board 1 after the two electronic components 2a and 2b are mounted on the printed board 1 according to the present embodiment. Moreover, FIG. 8 (b) is a top view in which the configuration in FIG. 8 (a) is viewed from directly above, and FIG. 8 (c) is a side view in which the configuration in FIG. 8 (a) is viewed from a lateral side.

In the present embodiment, arrangements of the electronic components 2, the component holes 7, and the wiring pattern 6 are similar to those in Embodiment 2. However, the handling for the bent-side lead wires 3a and 3b of the two electronic components 2a and 2b is different. Two lead wires 3a and 3b are fixed by soldering to be integrated in Embodiment 2, whereas the bent-side lead wires 3a and 3b are twisted to be integrated in the present embodiment. In other words, the lead wires are not fixed to each other by another member as in Embodiment 2, but a method of structurally fixing the lead wires with each other by themselves is devised.

The fixing method is not limited to the method of twisting the lead wires with each other, but any method may be used as long as the lead wires can be structurally fixed with each other. For example, a configuration in which a small ring portion is formed by twisting one of bent-side lead wires, and the other bent-side lead wire is passed through the ring portion may be used.

By the configuration described above, the electronic components 2a and 2b are integrated by twisting the lead wires, and the lead wires are not arranged in the same straight line in a way similar to Embodiment 2, so that the positional relationship between the electronic components 2 and the printed board 1 is uniquely determined, and the electronic components 2 are nearly fixed in any direction in which they are inclined, and the possibility of falling is very small.

In this case, regarding the method of mounting the electronic components 2 on the printed board 1, because the lead wires 3 are not easily twisted after the electronic components 2 are mounted on the printed board 1, it is desirable that the two electronic components 2, which are already integrated by twisting the lead wires 3, are mounted on the printed board 1.

As described above, when the U-shape formed electronic components having an axial lead shape are mounted upright on the printed board, the wiring pattern is formed on the circuit board according to the present embodiment in a state where the component holes for inserting the lead wires of the two electronic components are arranged so as not to be in the same straight line, and when the two electronic components are inclined so as to place the bent-side lead wires close to each other, the bent-side lead wires are brought into contact and supported with each other before the components fall, and the bent-side lead wires have the same electric potential. Moreover, because the bent-side lead wires are fixed and integrated by being twisted with each other, a possibility that the electronic components fall can be more decreased in comparison with the circuit board described in Embodiment 1. Moreover, in comparison with a case in which the lead wires are fixed by soldering or the like as the circuit board described in Embodiment 2, no other member and tool are required, so that the work efficiency can be further improved.

Although the method of mounting two electronic components is explained in the present embodiment, the electronic components may be prevented from falling by twisting and fixing lead wires of three electronic components or more. In this case, if at least two electronic components among the three or more electronic components are configured in the same way as in the present embodiment, the same effect can be achieved.

INDUSTRIAL APPLICABILITY

A circuit board related to the present invention is especially effective when it is applied to a circuit board on which a high-power element is mounted.

What is claimed is:

1. A circuit board in which two electronic components having an axial lead shape are formed to have a U-shape and mounted upright on a printed board, wherein
   a bent-side lead wire of a first electronic component and a bent-side lead wire of a second electronic component are set to be at the same electric potential;
   component holes for inserting the lead wires of the electronic components are provided on the printed board in a state where the component holes are not arranged in a same straight line, and when each of the electronic components is inclined in a direction in which the bent-side lead wires are placed close to each other, the bent-side lead wires are brought into contact and supported with each other so as to prevent the electronic components from inclining any more; and
   each of the electronic components fixed in the component holes is inclined in a direction in which the bent-side lead wires are placed close to each other.

2. A circuit board as recited in claim 1, wherein
   regarding a first line segment connecting two component holes for inserting lead wires of a first electric component, a component hole for inserting a bent-side lead wire of a second electronic component is located within an area on the printed board in which the first line segment can be moved in a direction perpendicular to the first line segment;
   regarding a second line segment connecting two component holes for inserting lead wires of the second electric component, a component hole for inserting a bent-side lead wire of the first electronic component is located within an area on the printed board in which the second line segment can be moved in a direction perpendicular to the second line segment; and
   a distance between the first and second line segments of the electronic components is shorter than a height of the U-shape formed electronic components.

3. A circuit board in which two electronic components having an axial lead shape are formed to have a U-shape and mounted upright on a printed board, wherein
   a bent-side lead wire of a first electronic component and a bent-side lead wire of a second electronic component are set to be at the same electric potential;
   component holes for inserting the lead wires of the electronic components are provided on the printed board in a state where the component holes are not arranged in a same straight line, and when at least one of the electronic components is inclined in a direction in which the bent-side lead wires are placed close to each other, the bent-side lead wires are brought into contact with each other; and a fixing means for fixing the bent-side lead wires of the electronic components, which are fixed in the component holes, to each other is provided.

4. A circuit board as recited in claim 3, wherein the fixing means performs soldering on a portion in which the bent-side lead wires of the electronic components are close to or in contact with each other.

5. A circuit board as recited in claim 3, wherein the fixing means is configured as a structure of the bent-side lead wires of the electronic components.

6. A circuit board as recited in claim 5, wherein the fixing means is configured by twisting the bent-side lead wires of the electronic components together.

7. A method of mounting the electronic components on the printed board in the circuit board as recited in claim 1, wherein each of the electronic components is mounted on the printed board to be inclined in a direction in which the bent-side lead wire of the first electronic component and the bent-side lead wire of the second electronic component are placed close to each other.

8. A method of mounting the electronic components on the printed board in the circuit board as recited in claim 2, comprising:

a step of mounting the electronic components upright on the printed board;

a step of inclining each of the electronic components in a direction in which the bent-side lead wire of the first electronic component and the bent-side lead wire of the second electronic component are placed close to each other; and a step of fixing the bent-side lead wires to each other.

9. A method of mounting the electronic components on the printed board in the circuit board as recited in claim 2, comprising:

a step of mounting the electronic components on the printed board in a state where each of the electronic components is inclined in a direction in which the bent-side lead wire of the first electronic component and the bent-side lead wire of the second electronic component are placed close to each other; and a step of fixing the bent-side lead wires to each other.

* * * * *